United States Patent
Cheong et al.

(10) Patent No.: US 7,668,578 B2
(45) Date of Patent: Feb. 23, 2010

(54) $MGB_2$ SUPERCONDUCTORS

(75) Inventors: Sang-Wook Cheong, Chatham, NJ (US); Namjung Hur, Piscataway, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 760 days.

(21) Appl. No.: 11/002,860

(22) Filed: Dec. 2, 2004

(65) Prior Publication Data

US 2005/0153842 A1  Jul. 14, 2005

Related U.S. Application Data

(63) Continuation of application No. 09/885,471, filed on Jun. 20, 2001, now Pat. No. 6,878,420.

(60) Provisional application No. 60/275,067, filed on Mar. 12, 2001.

(51) Int. Cl.
*H01L 39/00* (2006.01)

(52) U.S. Cl. ............... 505/150; 501/96.1; 501/96.3; 501/108; 420/402; 420/901; 423/155; 423/289

(58) Field of Classification Search ............ None
See application file for complete search history.

(56) References Cited

U.S. PATENT DOCUMENTS

| | | | | |
|---|---|---|---|---|
| 4,242,419 | A | * | 12/1980 | Dayem et al. ............... 428/661 |
| 4,880,773 | A | * | 11/1989 | Itozaki et al. ............... 505/120 |
| 4,970,060 | A | * | 11/1990 | Belt et al. ................. 252/519.1 |
| 2002/0111275 | A1 | * | 8/2002 | Finnemore et al. .......... 505/100 |

OTHER PUBLICATIONS

S. L. Bud'ko et al. "Boron Isotope Effect in Superconducting MgB2" Jan. 2001, Physical Review Letters. vol. 86, No. 9.*
Nagamatsu, Jun, et al., *Superconductivity at 39 K in magnesium diboride*, Nature, vol. 410, p. 63-64, Mar. 1, 2001.
Canfield, P.C., et al., *Superconductivity in Dense $MgB_2$ Wires*, Physical Review Letters, vol. 86, No. 11, p. 2423-2426, Mar. 12, 2001.
Canfield, P.C., et al., *Superconductivity in Dense $MgB_2$ Wires*, Physical Review Letters, vol. 86, No. 11, p. 2423-2426, Mar. 12, 2001.

* cited by examiner

*Primary Examiner*—Stanley Silverman
*Assistant Examiner*—Paul Wartalowicz
(74) *Attorney, Agent, or Firm*—John F. McCabe

(57) ABSTRACT

A solid structure includes a substrate and a layer located on a surface of the substrate. The layer includes crystalline or polycrystalline $MgB_2$.

15 Claims, 4 Drawing Sheets

$MGB_2$ SUPERCONDUCTORS

This is a continuation of application Ser. No. 09/885,471 filed on Jun. 20, 2001 now U.S. Pat. No. 6,878,420.

This application claims the benefit of U.S. Provisional Application No. 60/275,067, filed on Mar. 12, 2001.

BACKGROUND

1. Field of the Invention

This invention relates to superconductors and devices based on superconductors.

2. Discussion of the Related Art

Recently, Akitmitsu et al. discovered that a well-known compound, i.e., $MgB_2$, exhibits superconductivity at temperatures lower than about 39 Kelvin (K). Powders formed of $MgB_2$ are produced by chemically reacting magnesium (Mg) and boron (B) at a temperature in the range of about 800° Celsius to about 950° Celsius (C.). Powders of polycrystalline $MgB_2$ in which individual crystalline grains of $MgB_2$ have diameters in the range of about 1 micron to about 50 microns are available commercially.

SUMMARY

In one aspect, the invention features a solid structure. The structure includes a substrate and a layer located on a surface of the substrate. The layer includes crystalline or polycrystalline $MgB_2$.

DETAILED DESCRIPTION OF THE EMBODIMENTS

Though recent discoveries have shown that $MgB_2$ is a superconductor. The available powder form of $MgB_2$ is not useful for many types of superconducting devices. Furthermore, the powder form of $MgB_2$ is not adapted to use in many manufacturing processes. For these superconducting devices and manufacturing processes, solid bodies and thin layers of $MgB_2$ are more convenient. Solid bodies and thin layers of $MgB_2$ are provided by processes of various embodiments.

Figure 1:
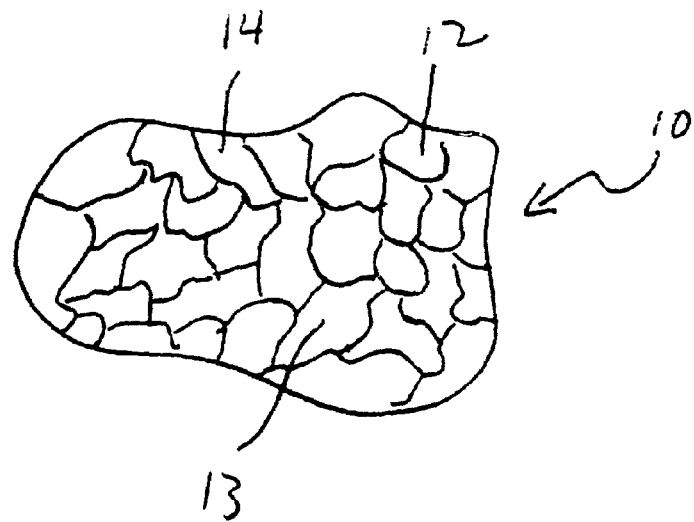
FIG. 1 is a magnified view of a portion of a solid polycrystalline body formed of $MgB_2$.

FIG. 1 shows a portion of a three-dimensional solid body 10 of $MgB_2$ having at least one linear dimension of 1 millimeter (mm) or more. The body 10 includes a plurality of crystalline grains 12-14 and is thus, polycrystalline. The grains 12-14 have diameters in the range of about 1 micron to about 50 microns. The solid body 10 is a superconductor, at least, for temperatures below about 39 K.

Figure 2:
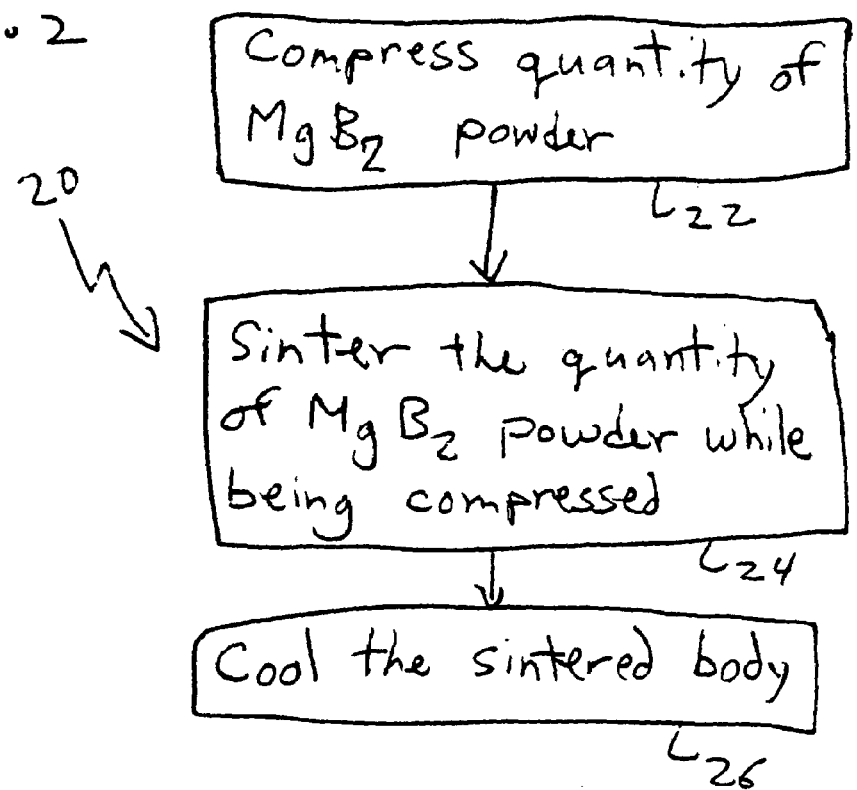
FIG. 2 is a flow chart for a process of producing the body of FIG. 1.

FIG. 2 is a flow chart for a sintering process 20 that produces a solid body of $MgB_2$, e.g., the polycrystalline body 10 of FIG. 1. The process 20 includes compressing a quantity of $MgB_2$ powder with a pressure in the range of about 100 bars to about 50,000 bars (step 22). While being compressed, the quantity of powder is sintered at a temperature of about 500° C. to about 900° C. (step 24). In an exemplary embodiment, a pressure of about 20,000 bars and a temperature of about 700° C. are applied to the quantity of $MgB_2$ powder for time in the range of about 0.5 hours to about 2.0 hours. After the sintering, the process 20 includes gradually cooling the sintered $MgB_2$ body to room temperature (step 26). The final sintered body is a polycrystalline solid adapted for use in superconducting devices and in extreme manufacturing processes such as pulsed laser deposition.

Figure 3:
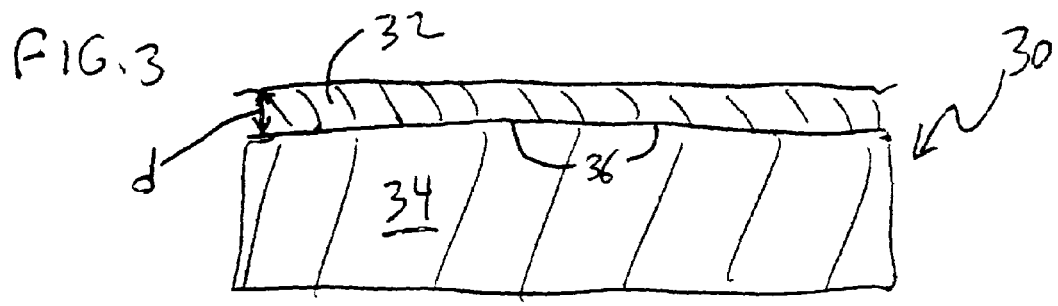
FIG. 3 shows a structure that includes a thin layer of $MgB_2$.

FIG. 3 shows a thin-layer structure 30 that includes a $MgB_2$ layer 32 and a substrate 34 on which the layer 32 is grown. The $MgB_2$ layer 32 is polycrystalline or crystalline and has a thickness "d" in the range of about 10 nanometers (nm) to about 1 micron. The $MgB_2$ layer 32 is superconducting at low temperatures, e.g., temperatures below about 39 K.

$MgB_2$ layer 32 and substrate 34 have similar lattice constants. In the plane of common surface 36, the lattice constants of the layer 32 and substrate 34 differ by less than 10 percent. In many embodiments, in-planar lattice constants differ by less than about 1 percent. The similarity of the in-plane lattice constants of the $MgB_2$ layer 32 and the substrate 34 enables the $MgB_2$ layer 32 to be grown in crystalline or polycrystalline form on the surface 36 of the substrate 34, because the similarity of in-plane lattice constants reduces strain energies during layer growth.

An exemplary substrate 34 is 6H-SiC (6-layer hexagonal silicon carbide), which has in-plane lattice constants of about 0.3081 nm along surface 36. These in-plane lattice constants are very similar to those of $MgB_2$. The lattice constants along surface 36 for the grown $MgB_2$ layer 32 are equal to about 0.3085 nm.

Other exemplary substrates 34 include crystalline or polycrystalline solids formed of cubic SiC, $LaAlO_3$, $SrTiO_3$, or sapphire. Since the substrate 34 is crystalline or polycrystalline and has in-plane lattice constants that closely match those of $MgB_2$, layer 32 is able to grow epitaxially or c-axis oriented on surface 36 of the substrate 34.

Various processes provide for making a thin-layer device. The processes include providing a solid body of $MgB_2$ and ejecting $MgB_2$ from the body by directing laser light onto the body. The processes also include growing a layer on a surface of a substrate from a portion of the ejected $MgB_2$.

Figure 4:
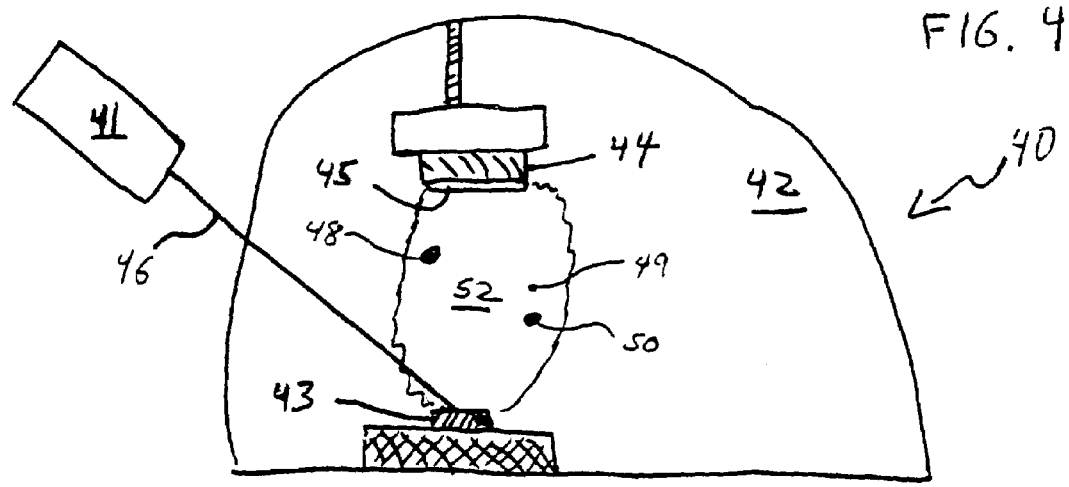
FIG. 4 shows a setup for producing the thin-layer structure of FIG. 3 by pulsed laser deposition (PLD)

FIG. 4 shows a setup 40 for producing the structure 30 of FIG. 3 by pulsed laser deposition (PLD). The setup 40 includes a pulsed ultraviolet (UV) laser 41, a vacuum chamber 42, a target pellet 43, a crystalline substrate 44. An exemplary pulsed UV laser 41 has a wavelength of about 250 nm, a pulse rate of about 0.5-10 Hz, and an energy density on the target of about 1-50 Joules/$cm^2$. The target pellet 43 is solid body formed of polycrystalline $MgB_2$, e.g., a solid body made by sintering process 20 of FIG. 2. The substrate 44 is an epitaxial growth base for $MgB_2$ such as a crystalline or polycrystalline solid of 6H-SiC, cubic SiC, $LaAlO_3$, $SrTiO_3$, or sapphire. The substrate 44 is positioned to face the surface of the target pellet 43 that is struck by an output beam 46 of the laser 41. For example, the substrate 44 may be held vertically above the target pellet 43 at a position that intersects a plume 52 of particles that is ejected from the target pellet 43 by the action of the pulsed laser beam 46 during PLD.

Figure 5:
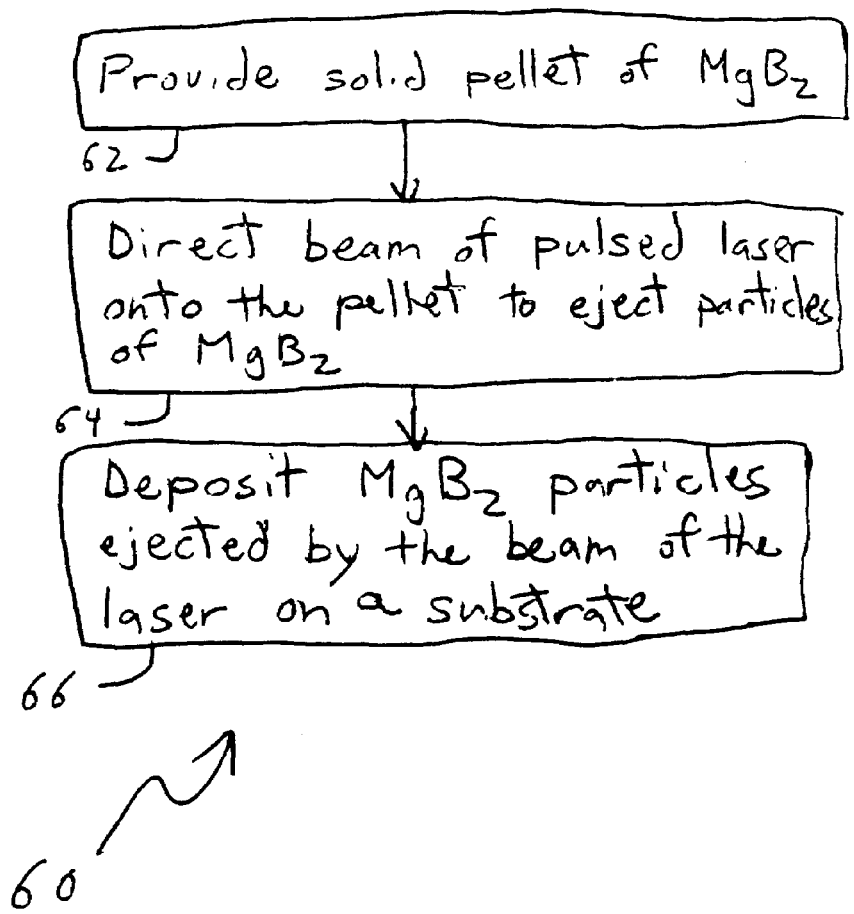
FIG. 5 is a flow chart for a process for making the structure of FIG. 3.

FIG. 5 is a flow chart showing a PLD process 60 for growing a layer 45 of $MgB_2$ with setup 40 of FIG. 4. The process 40 includes providing a solid target pellet 43 of polycrystalline $MgB_2$, e.g., a pellet produced by sintering process 20 of FIG. 2 (step 62). The process 40 also includes directing a pulsed output beam 46 from laser 41 onto the solid target pellet 43 (step 64). The pulsed output beam 46 ejects $MgB_2$ particles 48-50 to form a plume 52 over the target pellet 43. The ejected particles 48-50 typically have diameters of about 0.1 nm to about 10 nm. A portion of the ejected particles 48-50 in the plume 52 are deposited on substrate 44 (step 66). The deposition produces an epitaxial growth of layer 45 of cubic $MgB_2$ provided that the substrate 44 has in-plane lattice constants that approximately match those of $MgB_2$ along the exposed surface of the substrate 44. For example, a mismatch of in-plane lattice constants by 1 percent still enables layer 45 to grow in a crystalline or polycrystalline form.

To improve the deposition of $MgB_2$, the substrate 44 and pellet 43 are positioned in a vacuum chamber 42, which maintains internal pressures in the range of about $10^{-8}$ Torr to about $10^{-4}$ Torr. Pressures in this range reduce oxidation of the $MgB_2$, which could produce MgO. The presence of MgO could otherwise interfere with the deposition of $MgB_2$. However, the inclusion of a small amount of MgO into the $MgB_2$ layer could enhance certain superconducting properties such as the value of the critical current.

FIG. 5 is an oblique view of a superconducting quantum interference device (SQUID) 70. The SQUID 70 is formed by etching thin-layer structure 30 of FIG. 3, e.g., by a lithographic process, to remove the $MgB_2$ from both central region 72 and tunneling junction regions 74, 76. After the etch, the structure includes a ring 78 of $MgB_2$ whose current properties can be used to measure the value of the magnetic flux through the central region 72.

Figure 6:
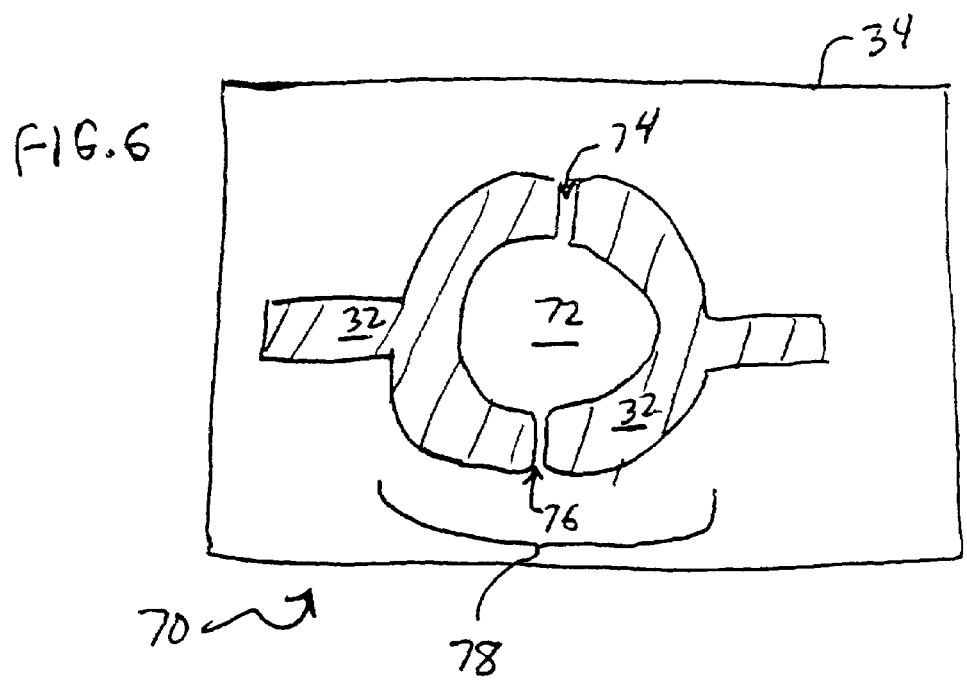
FIG. 6 shows a superconducting quantum interference device (SQUID) formed from the thin-layer structure of FIG. 3.
Figure 7:
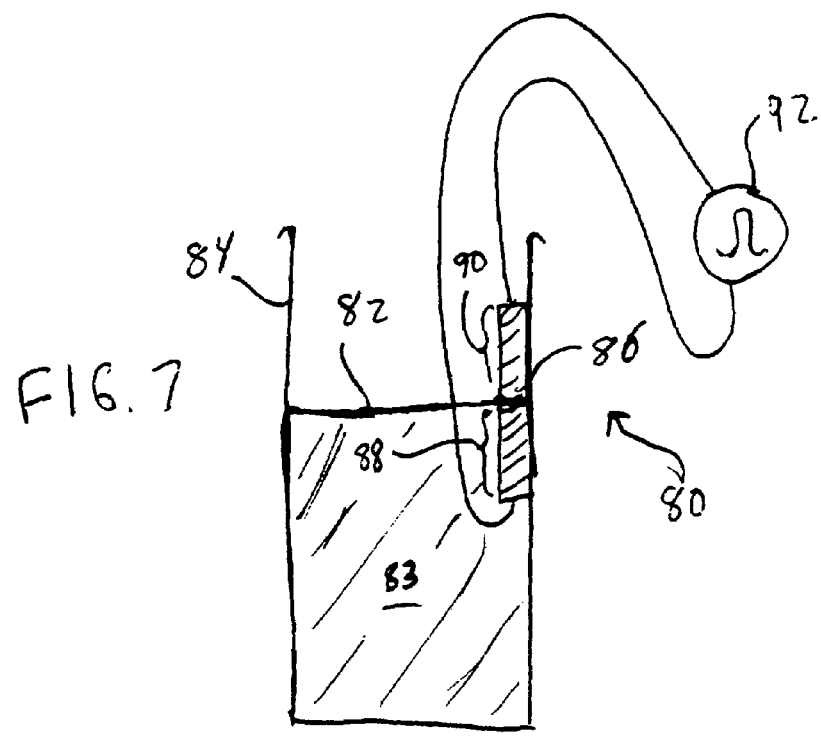
FIG. 7 shows a helium level gauge that uses the body of FIG. 1.

FIG. 6 shows a liquid helium (He) gauge 80 that measures the height of the surface 82 of the He liquid 83 in dewar 84. The gauge includes an elongated body 86 of solid $MgB_2$, which is formed by sintering process 20 of FIG. 2. The body 86 includes a cooler portion 88, i.e., located in the He liquid 83, and a warmer portion 90, i.e., located above the He liquid 83. The cooler portion 88 is superconducting, and the warmer portion 90 is not superconducting. The gauge 80 determines the level of the surface 82 from the reading from an ohmmeter 92. Changes in the reading are proportional to level changes of the liquid He, because the resistance of the body 86 of solid $MgB_2$ is proportional to the length of the body 86 that is not in the He liquid 83, i.e., the length that is cooled to a superconducting state.

From the disclosure, drawings, and claims, other embodiments of the invention will be apparent to those skilled in the art.

What is claimed is:

1. A solid structure, comprising:
   a substrate; and
   a crystalline or polycrystalline layer of $MgB_2$ being located on a surface of the substrate; and
   wherein the substrate is crystalline or polycrystalline and projections along the surface of corresponding lattice constants of the layer and the substrate match to within ten percent.

2. The structure of claim 1, wherein the layer has a thickness of less than about 1 micron.

3. The structure of claim 1, wherein the substrate is crystalline or polycrystalline and projections along the surface of corresponding lattice constants of the layer and the substrate match to within about one percent.

4. The structure of claim 1, wherein the substrate comprises one of SiC, $LaAlO_3$, and sapphire.

5. The structure of claim 1, wherein the layer forms a ring structure broken by two junction regions.

6. The solid structure of claim 1, wherein the layer is able to function as a superconductor.

7. A solid structure, comprising:
   a substrate; and
   a crystalline or polycrystalline layer of $MgB_2$ being located on a surface of the substrate; and
   wherein the layer has a thickness of less than about 1 micron.

8. The structure of claim 7, wherein the substrate is crystalline or polycrystalline.

9. The structure of claim 8, wherein projections along the surface of corresponding lattice constants of the layer and the substrate match to within about ten percent.

10. The structure of claim 8, wherein projections along the surface of corresponding lattice constants of the layer and the substrate match to within about one percent.

11. The structure of claim 7, wherein the substrate comprises one of SiC, $LaAlO_3$, and sapphire.

12. The structure of claim 7, wherein the layer forms a ring structure broken by two junction regions.

13. The solid structure of claim 7, wherein the layer is able to function as a superconductor.

14. The structure of claim 1, wherein the substrate comprises $SiO_2$.

15. The structure of claim 7, wherein the substrate comprises $SiO_2$.

\* \* \* \* \*

UNITED STATES PATENT AND TRADEMARK OFFICE
CERTIFICATE OF CORRECTION

PATENT NO. : 7,668,578 B2 Page 1 of 1
APPLICATION NO. : 11/002860
DATED : February 23, 2010
INVENTOR(S) : Cheong et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1388 days.

Signed and Sealed this

Twenty-eighth Day of December, 2010

David J. Kappos
*Director of the United States Patent and Trademark Office*